(12) United States Patent
Kim et al.

(10) Patent No.: US 11,386,854 B2
(45) Date of Patent: Jul. 12, 2022

(54) PIXEL CIRCUIT AND DISPLAY APPARATUS HAVING THE SAME

(71) Applicant: Samsung Display Co., Ltd., Yongin-si (KR)

(72) Inventors: Gun-Hee Kim, Seoul (KR); Sang-Ho Park, Hwaseong-si (KR); Ju-Won Yoon, Suwon-si (KR); Seung-Chan Lee, Hwaseong-si (KR); Joo-Hee Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/266,846

(22) PCT Filed: Jun. 25, 2019

(86) PCT No.: PCT/KR2019/007683
§ 371 (c)(1),
(2) Date: Feb. 8, 2021

(87) PCT Pub. No.: WO2020/036307
PCT Pub. Date: Feb. 20, 2020

(65) Prior Publication Data
US 2021/0295784 A1 Sep. 23, 2021

(30) Foreign Application Priority Data
Aug. 13, 2018 (KR) .................... 10-2018-0094530

(51) Int. Cl.
*G09G 3/3291* (2016.01)
*H01L 27/32* (2006.01)

(52) U.S. Cl.
CPC ....... *G09G 3/3291* (2013.01); *H01L 27/3244* (2013.01); *G09G 2320/0673* (2013.01); *G09G 2330/021* (2013.01)

(58) Field of Classification Search
CPC ......... G09G 3/3233; G09G 2320/0233; G09G 2300/0413; G09G 2310/0245
See application file for complete search history.

(56) References Cited

U.S. PATENT DOCUMENTS 9,356,153 B2   5/2016   Khang et al.
9,478,169 B2   10/2016  Lim et al.
(Continued)

FOREIGN PATENT DOCUMENTS

JP          5152448 B2    2/2013
KR   10-2015-0045111 A    4/2015
(Continued)

*Primary Examiner* — Shaheda A Abdin
(74) *Attorney, Agent, or Firm* — Lewis Roca Rothgerber Christie LLP

(57) ABSTRACT

A pixel circuit includes: a driving switching element; a data initializer to initialize a voltage of a control electrode of the driving switching element; a data writer to write a data voltage to the driving switching element; an organic light emitting element; an organic light emitting element initializer to initialize an anode electrode of the organic light emitting element to a second initialization voltage based on an organic light emitting element initialization gate signal; and a light emitting controller to control an emission of the organic light emitting element. The organic light emitting element initializer includes: a control electrode to receive the organic light emitting element initialization gate signal; an input electrode to receive the second initialization voltage; an output electrode connected to the anode electrode; and a conductive layer to receive a compensation control signal that is different from the organic light emitting element initialization gate signal.

19 Claims, 10 Drawing Sheets

(56) References Cited

U.S. PATENT DOCUMENTS

| | | | |
|---|---|---|---|
| 10,074,710 B2 | 9/2018 | Ebisuno et al. | |
| 2004/0100203 A1* | 5/2004 | Kobayashi | G09G 3/3233 |
| | | | 315/169.3 |
| 2004/0174349 A1* | 9/2004 | Libsch | H01L 27/12 |
| | | | 257/E27.111 |
| 2006/0061526 A1 | 3/2006 | Shirasaki et al. | |
| 2011/0273419 A1 | 11/2011 | Park et al. | |
| 2015/0108481 A1 | 4/2015 | Khang et al. | |
| 2015/0287362 A1 | 10/2015 | Lee et al. | |
| 2015/0379923 A1* | 12/2015 | Lee | H01L 27/3272 |
| | | | 345/206 |
| 2015/0379930 A1* | 12/2015 | Lee | G09G 3/3233 |
| | | | 345/76 |
| 2016/0104424 A1 | 4/2016 | Lim et al. | |
| 2016/0125809 A1 | 5/2016 | Hwang | |
| 2018/0069069 A1 | 3/2018 | Ebisuno et al. | |
| 2018/0166516 A1 | 6/2018 | Chai et al. | |
| 2018/0166519 A1 | 6/2018 | Kim et al. | |

FOREIGN PATENT DOCUMENTS

| | | |
|---|---|---|
| KR | 10-2016-0044078 A | 4/2016 |
| KR | 10-2016-0052943 A | 5/2016 |
| KR | 10-2017-0036865 A | 4/2017 |
| KR | 10-2018-0026602 A | 3/2018 |

* cited by examiner

FIG. 7

| VGL | VINT2 | ANODE | T7 OPERATION |
|---|---|---|---|
| -13.6 | -14.1 | -11.7 | X |
| -14.6 | -14.1 | -12.3 | X |
| -15.6 | -14.1 | -13.2 | X |
| -16.6 | -14.1 | -13.9 | X |
| -17.6 | -14.1 | -14.1 | O |

FIG. 8

| VGL | VINT2 | ANODE | T7 OPERATION |
|---|---|---|---|
| -13.6 | -14.1 | -12.7 | X |
| -14.6 | -14.1 | -13.6 | X |
| -15.6 | -14.1 | -14.1 | O |
| -16.6 | -14.1 | -14.1 | O |
| -17.6 | -14.1 | -14.1 | O |

PIXEL CIRCUIT AND DISPLAY APPARATUS HAVING THE SAME

CROSS-REFERENCE TO RELATED APPLICATIONS

This application is a National Phase Patent Applications and claims priority to and the benefit of International Application Number PCT/KR2019/007683, filed on Jun. 25, 2019, which claims priority to Korean Patent Application Number 10-2018-0094530, filed on Aug. 13, 2018, the entire contents of each of which are incorporated herein by reference.

TECHNICAL FIELD

Aspects of example embodiments of the present disclosure relate to a pixel circuit, and a display apparatus including the pixel circuit. More particularly, aspects of example embodiments of the present disclosure relate to a pixel circuit for enhancing reliability and reducing power consumption due to a decrease of a driving voltage, and a display apparatus including the pixel circuit.

BACKGROUND

Generally, a display apparatus includes a display panel and a display panel driver. The display panel includes a plurality of gate lines, a plurality of data lines, a plurality of emission lines, and a plurality of pixels. The display panel driver includes a gate driver, a data driver, an emission driver, and a driving controller. The gate driver outputs gate signals to the gate lines. The data driver outputs data voltages to the data lines. The emission driver outputs emission signals to the emission lines. The driving controller controls the gate driver, the data driver, and the emission driver.

For high luminance driving, an absolute value of a power voltage, an absolute value of an initialization voltage, and an absolute value of a gate low level voltage may need to be increased. Due to the increase of the absolute value of the power voltage, the absolute value of the initialization voltage, and the absolute value of the gate low level voltage, the power consumption of the display apparatus may increase, and the reliability of a switching element of a driving circuit and the reliability of a switching element of a pixel may be reduced.

The above information disclosed in this Background section is for enhancement of understanding of the background of the present disclosure, and therefore, it may contain information that does not constitute prior art.

DETAILED EXPLANATION OF THE INVENTION

Technical Purpose

One or more example embodiments of the present disclosure are directed to a pixel circuit capable of enhancing reliability and reducing power consumption due to a decrease of a driving voltage.

One or more example embodiments of the present disclosure are directed to a display apparatus including the pixel circuit.

Technical Solution

In an example embodiment of a pixel circuit according to the present disclosure, the pixel circuit includes: a driving switching element; a data initializer configured to initialize a voltage of a control electrode of the driving switching element to a first initialization voltage based on a data initialization gate signal; a data writer configured to write a data voltage to the control electrode of the driving switching element based on a data write gate signal; an organic light emitting element; an organic light emitting element initializer configured to initialize an anode electrode of the organic light emitting element to a second initialization voltage based on an organic light emitting element initialization gate signal; and a light emitting controller configured to control an emission of the organic light emitting element based on an emission signal. The organic light emitting element initializer includes: a control electrode configured to receive the organic light emitting element initialization gate signal; an input electrode configured to receive the second initialization voltage; an output electrode connected to the anode electrode; and a conductive layer opposite to the control electrode of the organic light emitting element initializer, and configured to receive a compensation control signal that is different from the organic light emitting element initialization gate signal.

In an example embodiment, the compensation control signal may be the first initialization voltage.

In an example embodiment, the data initializer may include a control electrode configured to receive the data initialization gate signal, an input electrode configured to receive the first initialization voltage, and an output electrode connected to the control electrode of the driving switching element.

In an example embodiment, the data writer may include a first data writer including a control electrode configured to receive the data write gate signal, an input electrode configured to receive the data voltage, and an output electrode connected to an input electrode of the driving switching element.

In an example embodiment, the data writer may further include a second data writer including a control electrode configured to receive the data write gate signal, an input electrode connected to an output electrode of the driving switching element, and an output electrode connected to the control electrode of the driving switching element.

In an example embodiment, the second data writer may include a (3-1)-th switching element and a (3-2)-th switching element that are connected in series, the (3-1)-th switching element may include a control electrode configured to receive the data write gate signal, an input electrode connected to an output electrode of the (3-2)-th switching element, and an output electrode connected to the control electrode of the driving switching element, and the (3-2)-th switching element may include a control electrode configured to receive the data write gate signal, an input electrode connected to the output electrode of the driving switching element, and the output electrode connected to the input electrode of the (3-1)-th switching element.

In an example embodiment, the pixel circuit may further include a stabilization capacitor including a first electrode configured to receive a first power voltage, and a second electrode connected to the input electrode of the (3-1)-th switching element.

In an example embodiment, the data initializer may include a (4-1)-th switching element and a (4-2)-th switching element that are connected in series, the (4-1)-th switching element may include a control electrode configured to receive the data initialization gate signal, an input electrode connected to an output electrode of the (4-2)-th switching element, and an output electrode connected to the control electrode of the driving switching element, and the (4-2)-th switching element may include a control electrode configured to receive the data initialization gate signal, an input electrode configured to receive the first initialization voltage, and the output electrode connected to the input electrode of the (4-1)-th switching element.

In an example embodiment, the input electrode of the (4-1)-th switching element may be connected to the input electrode of the (3-1)-th switching element.

In an example embodiment, the pixel circuit may further include a storage capacitor including a first electrode configured to receive a first power voltage, and a second electrode connected to the control electrode of the driving switching element.

In an example embodiment, the organic light emitting element initializer may include a (7-1)-th switching element and a (7-2)-th switching element that are connected in series, the (7-1)-th switching element may include a control electrode configured to receive the organic light emitting element initialization gate signal, an input electrode connected to an output electrode of the (7-2)-th switching element, and an output electrode connected to the anode electrode of the organic light emitting element, and the (7-2)-th switching element may include a control electrode configured to receive the organic light emitting element initialization gate signal, an input electrode configured to receive the second initialization voltage, and the output electrode connected to the input electrode of the (7-1)-th switching element.

In an example embodiment, the light emitting controller may include a first light emitting controller including a control electrode configured to receive the emission signal, an input electrode configured to receive a first power voltage, and an output electrode connected to an input electrode of the driving switching element.

In an example embodiment, the light emitting controller may further include a second light emitting controller including a control electrode configured to receive the emission signal, an input electrode connected to an output electrode of the driving switching element, and an output electrode connected to the anode electrode of the organic light emitting element.

In an example embodiment, the organic light emitting element may include: the anode electrode; a first light emitting layer on the anode electrode; a second light emitting layer on the first light emitting layer; and a cathode electrode on the second light emitting layer.

In an example embodiment, the organic light emitting element may further include: a first hole transport layer between the anode electrode and the first light emitting layer; a first electron transport layer on the first light emitting layer; an n-type charge generation layer on the first electron transport layer; a p-type charge generation layer on the n-type charge generation layer; a second hole transport layer between the p-type charge generation layer and the second light emitting layer; and a second electron transport layer between the second light emitting layer and the cathode electrode.

In an example embodiment, the organic light emitting element initialization gate signal may have a phase that is the same as a phase of the data write gate signal.

In an example embodiment, the organic light emitting element initialization gate signal may have a phase that is the same as a phase of the data initialization gate signal.

In an example embodiment of a display apparatus according to the present disclosure, the display apparatus includes: a display panel including a plurality of pixels; a gate driver configured to output a gate signal to the display panel; a data driver configured to output a data voltage to the display panel; and an emission driver configured to output an emission signal to the display panel. At least one of the pixels includes: a driving switching element; a data initializer configured to initialize a voltage of a control electrode of the driving switching element to a first initialization voltage based on a data initialization gate signal; a data writer configured to write the data voltage to the control electrode of the driving switching element based on a data write gate signal; an organic light emitting element; an organic light emitting element initializer configured to initialize an anode electrode of the organic light emitting element to a second initialization voltage based on an organic light emitting element initialization gate signal; and a light emitting controller configured to control an emission of the organic light emitting element based on the emission signal. The organic light emitting element initializer includes: a control electrode configured to receive the organic light emitting element initialization gate signal; an input electrode configured to receive the second initialization voltage; an output electrode connected to the anode electrode; and a conductive layer opposite to the control electrode of the organic light emitting element initializer, and configured to receive a compensation control signal that is different from the organic light emitting element initialization gate signal.

In an example embodiment, the compensation control signal may be the first initialization voltage.

Effect of the Invention

According to one or more example embodiments of the present disclosure, in the pixel circuit and the display apparatus including the pixel circuit, a signal that is different from the signal applied to a control electrode of an organic light emitting element initialization switching element may be applied to a conductive layer opposite to the control electrode of the organic light emitting element initialization switching element, so that a threshold voltage of the organic light emitting element initialization switching element may be decreased.

According to one or more example embodiments of the present disclosure, the threshold voltage of the organic light emitting element initialization switching element may be decreased so that a driving voltage of the display apparatus may be decreased. Thus, a power consumption of the display apparatus may be reduced.

According to one or more example embodiments of the present disclosure, the threshold voltage of the organic light emitting element initialization switching element may be decreased so that the reliability of a switching element of a driving circuit of the display apparatus and the reliability of the switching element of the pixel may be enhanced.

BRIEF EXPLANATION OF THE DRAWINGS

The above and other aspects and features of the present disclosure will become more apparent to those skilled in the art from the following detailed description of the example embodiments with reference to the accompanying drawings.

FIG. 7 is a table illustrating voltages at nodes of an organic light emitting element and an organic light emitting element initialization switching element according to a comparative example.

FIG. 8 is a table illustrating voltages at nodes of the organic light emitting element and the organic light emitting element initialization switching element of FIG. 2.

BEST MODE FOR CARRYING OUT THE INVENTION

Hereinafter, example embodiments of the present disclosure will be described in more detail with reference to the accompanying drawings.

Figure 1:
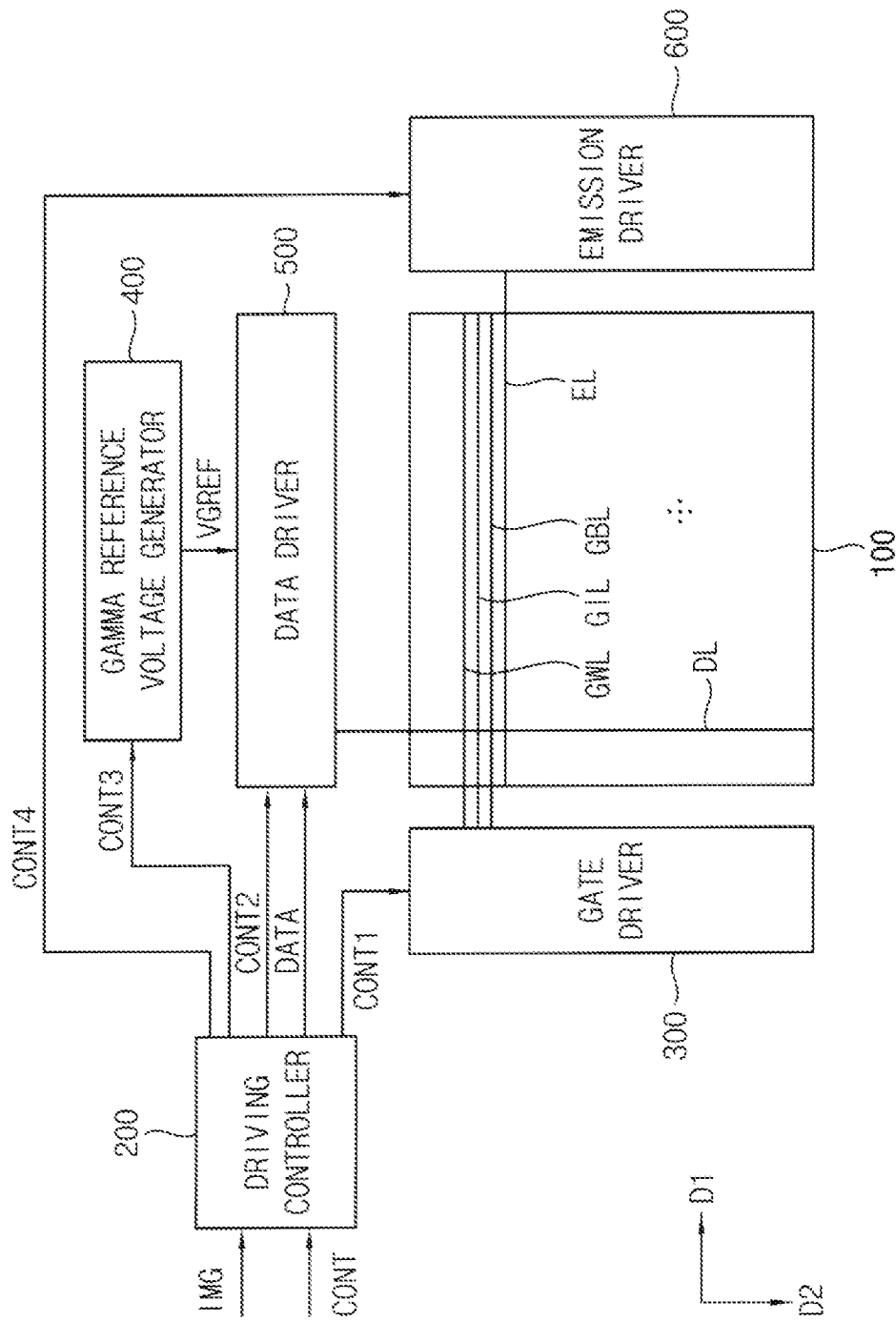
FIG. 1 is a block diagram illustrating a display apparatus according to an example embodiment of the present disclosure.

FIG. 1 is a block diagram illustrating a display apparatus according to an example embodiment of the present disclosure.

Referring to FIG. 1, the display apparatus includes a display panel 100 and a display panel driver. The display panel driver includes a driving controller 200, a gate driver 300, a gamma reference voltage generator 400, a data driver 500, and an emission driver 600.

The display panel 100 has a display region at (e.g., in or on) which an image is displayed, and a peripheral region adjacent to the display region.

The display panel 100 includes a plurality of gate lines GWL, GIL, and GBL, a plurality of data lines DL, a plurality of emission lines EL, and a plurality of pixels electrically connected to the gate lines GWL, GIL, and GBL, the data lines DL, and the emission lines EL. The gate lines GWL, GIL, and GBL extend in a first direction D1, the data lines DL extend in a second direction D2 crossing the first direction D1, and the emission lines EL extend in the first direction D1.

The driving controller 200 receives input image data IMG and an input control signal CONT from an external apparatus. For example, in some embodiments, the input image data IMG may include red image data, green image data, and blue image data. In some embodiments, the input image data IMG may include white image data. In some embodiments, the input image data IMG may include magenta image data, cyan image data, and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4, and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals for driving the gate lines GWL, GIL, and GBL in response to the first control signal CONT1 received from the driving controller 200. The gate driver 300 may sequentially output the gate signals to the gate lines GWL, GIL, and GBL.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an example embodiment, the gamma reference voltage generator 400 may be disposed in the driving controller 200, or in the data driver 500. In other words, in some embodiments, the gamma reference voltage generator 400 may be integrally formed with the driving controller 200, or with the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

For example, the data driver 500 may be integratedly formed with the driving controller 200, so that the data driver 500 and the driving controller 200 may form a timing controller embedded data driver TED.

The emission driver 600 generates emission signals to drive the emission lines EL in response to the fourth control signal CONT4 received from the driving controller 200. The emission driver 600 may output the emission signals to the emission lines EL.

Figure 2:
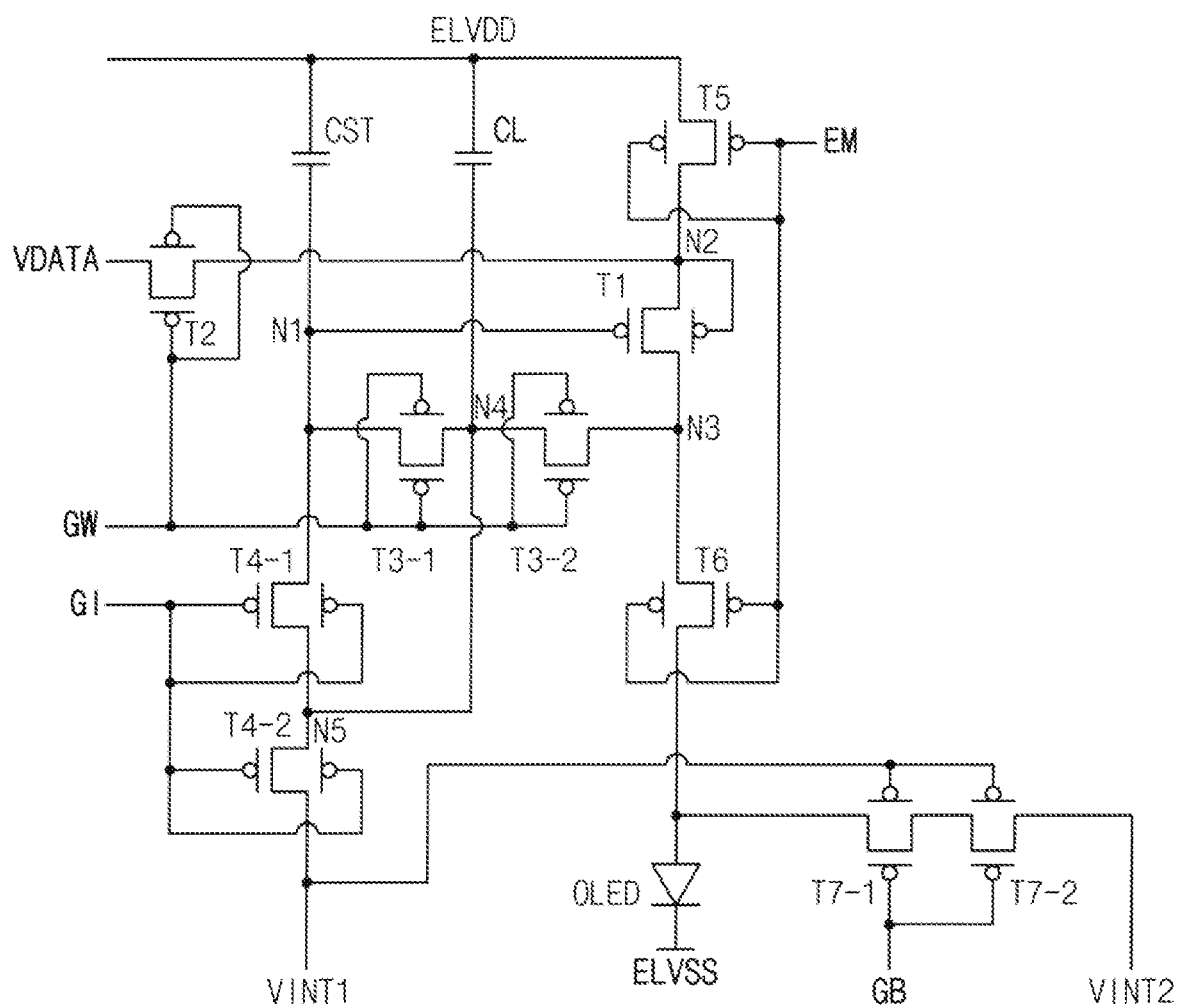
FIG. 2 is a circuit diagram illustrating a pixel of a display panel of FIG. 1.
Figure 3:
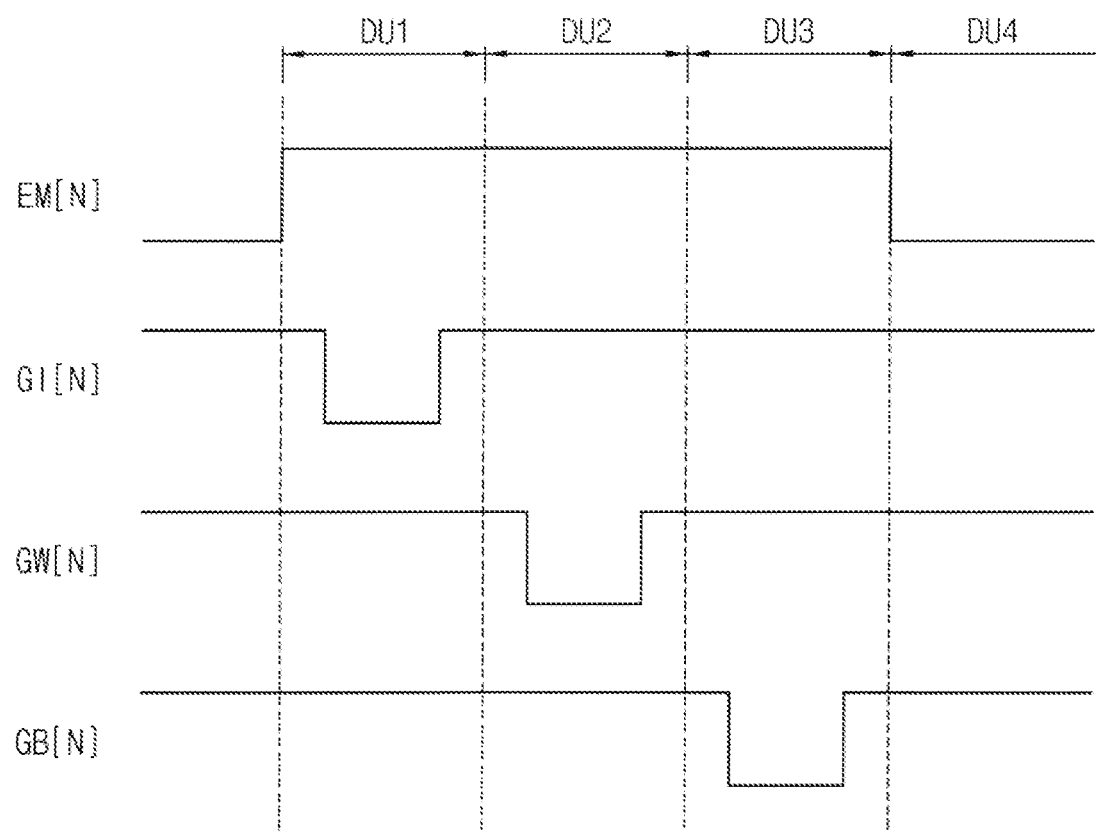
FIG. 3 is a timing diagram illustrating input signals applied to the pixel of FIG. 2.

FIG. 2 is a circuit diagram illustrating a pixel of the display panel 100 of FIG. 1. FIG. 3 is a timing diagram illustrating input signals applied to the pixel of FIG. 2.

Referring to FIGS. 1 to 3, the display panel 100 includes the plurality of the pixels. Each of the pixels includes an organic light emitting diode OLED.

The pixels receive a data write gate signal GW, a data initialization gate signal GI, an organic light emitting diode initialization signal GB, the data voltage VDATA, and the emission signal EM. The organic light emitting diodes OLED of the pixels emit light corresponding to a level of the data voltage VDATA to display the image.

At least one of the pixels may include a driving switching element (e.g., a driving transistor) T1, a data initializer T4-1 and T4-2, a data writer T2, T3-1, and T3-2, an organic light emitting element (e.g., the organic light emitting diode) OLED, an organic light emitting element initializer T7-1 and T7-2, and a light emitting controller T5 and T6. The pixel may further include a storage capacitor CST and a stabilization capacitor CL.

The data initializer T4-1 and T4-2 initializes a voltage at a control electrode (or a first node) N1 of the driving switching element T1 to a first initialization voltage VINT1.

The data initializer T4-1 and T4-2 may include a control electrode for receiving the data initialization gate signal GI, an input electrode for receiving the first initialization voltage VINT1 and an output electrode connected to the control electrode N1 of the driving switching element T1.

For example, the data initializer T4-1 and T4-2 may include a (4-1)-th switching element (e.g., a (4-1)-th transistor) T4-1 and a (4-2)-th switching element (e.g., a (4-2)-th transistor) T4-2, which are connected to each other in series. The (4-1)-th switching element T4-1 may include a control electrode for receiving the data initialization gate signal GI, an input electrode connected to an output electrode (or a fifth node) N5 of the (4-2)-th switching element T4-2, and an output electrode connected to the control electrode N1 of the driving switching element T1. The (4-2)-th switching element may include a control electrode for receiving the data initialization gate signal GI, an input electrode for receiving the first initialization voltage VINT1, and the output electrode N5 connected to the input electrode of the (4-1)-th switching element T4-1.

When the data initializer T4-1 and T4-2 includes the (4-1)-th switching element T4-1 and the (4-2)-th switching element T4-2, which are connected to each other in series, a current leakage (e.g., a leakage current) due to a high voltage applied to opposite ends (e.g., both ends) of the data initializer T4-1 and T4-2 may be prevented or reduced.

The data writer T2, T3-1, and T3-2 may write a data voltage to the control electrode N1 of the driving switching element T1 based on a data write gate signal GW.

The data writer T2, T3-1, and T3-2 may include a first data writer (e.g., a second transistor) T2 including a control electrode for receiving the data write gate signal GW, an input electrode for receiving the data voltage VDATA, and an output electrode connected to an input electrode (or a second node) N2 of the driving switching element T1.

In addition, the data writer T2, T3-1, and T3-2 may further include a second data writer T3-1 and T3-2 including a control electrode for receiving the data write gate signal GW, an input electrode connected to an output electrode N3 of the driving switching element T1, and an output electrode connected to the control electrode N1 of the driving switching element T1.

For example, the second data writer T3-1 and T3-2 may include a (3-1)-th switching element (e.g., a (3-1)-th transistor) T3-1 and a (3-2)-th switching element (e.g., a (3-2)-th transistor) T3-2, which are connected to each other in series. The (3-1)-th switching element T3-1 may include a control electrode for receiving the data write gate signal GW, an input electrode connected to an output electrode (or a fourth node) N4 of the (3-2)-th switching element T3-2, and an output electrode connected to the control electrode N1 of the driving switching element T1. The (3-2)-th switching element may include a control electrode for receiving the data write gate signal GW, an input electrode connected to the output electrode N3 of the driving switching element T1, and the output electrode N4 connected to the input electrode of the (3-1)-th switching element T3-1.

When the second data writer T3-1 and T3-2 includes the (3-1)-th switching element T3-1 and the (3-2)-th switching element T3-2, which are connected to each other in series, a current leakage (e.g., a leakage current) due to a high voltage applied to opposite ends (e.g., both ends) of the second data writer T3-1 and T3-2 may be prevented or reduced.

The organic light emitting element initializer T7-1 and T7-2 initializes an anode electrode of the organic light emitting element OLED to a second initialization voltage VINT2 based on the organic light emitting diode initialization signal GB.

For example, an absolute value of the second initialization voltage VINT2 may be greater than an absolute value of the first initialization voltage VINT1. For high luminance driving, an absolute value of a second power voltage ELVSS, the absolute value of the initialization voltage, and an absolute value of a low level VGL of the gate signal may increase, and a drain-source voltage VDS of the (3-1)-th switching element T3-1, the (3-2)-th switching element T3-2, the (4-1)-th switching element T4-1, and the (4-2)-th switching element T4-2 may increase so that the leakage may occur. Thus, the first initialization voltage VINT1 and the second initialization voltage VINT2 may be set differently (e.g., may have a different voltage level from each other).

The organic light emitting element initializer T7-1 and T7-2 may include a (7-1)-th switching element (e.g., a (7-1)-th transistor) T7-1 and a (7-2)-th switching element (e.g., a (7-2)-th transistor) T7-2, which are connected to each other in series. The (7-1)-th switching element T7-1 may include a control electrode for receiving the organic light emitting element initialization gate signal GB, an input electrode connected to an output electrode of the (7-2)-th switching element T7-2, and an output electrode connected to the anode electrode of the organic light emitting element OLED. The (7-2)-th switching element may include a control electrode for receiving the organic light emitting element initialization gate signal GB, an input electrode for receiving the second initialization voltage VINT2, and the output electrode connected to the input electrode of the (7-1)-th switching element T7-1.

The light emitting controller T5 and T6 controls a light emission of the organic light emitting element OLED based on the emission signal EM.

The light emitting controller T5 and T6 may include a first light emitting controller (e.g., a fifth transistor) T5 including a control electrode for receiving the emission signal EM, an input electrode for receiving a first power voltage ELVDD, and an output electrode connected to the input electrode N2 of the driving switching element T1.

The light emitting controller T5 and T6 may further include a second light emitting controller (e.g., a sixth transistor) T6 including a control electrode for receiving the emission signal EM, an input electrode connected to the output electrode N3 of the driving switching element T1, and an output electrode connected to the anode electrode of the organic light emitting element OLED.

The storage capacitor CST includes a first electrode for receiving the first power voltage ELVDD, and a second electrode connected to the control electrode N1 of the driving switching element T1.

The stabilization capacitor CL includes a first electrode for receiving the first power voltage ELVDD, and a second electrode connected to the input electrode of the (3-1)-th switching element T3-1. The voltage at the input electrode of the (3-1)-th switching element T3-1 is stabilized by the stabilization capacitor CL so that the current leakage through the (3-1)-th switching element T3-1 and the (3-2)-th switching element T3-2 may be reduced.

The second electrode of the stabilization capacitor CL may also be connected to the input electrode of the (4-1)-th switching element T4-1. The voltage at the input electrode of the (4-1)-th switching element T4-1 is stabilized by the stabilization capacitor CL so that the current leakage through the (4-1)-th switching element T4-1 and the (4-2)-th switching element T4-2 may be reduced.

The organic light emitting element OLED includes the anode electrode, and a cathode electrode for receiving the second power voltage ELVSS.

In FIG. 3, during a first duration DU1, the first node N1 and the storage capacitor CST are initialized in response to the data initialization gate signal GI. During a second duration DU2, a threshold voltage |VTH| of the first switching element T1 is compensated, and the data voltage VDATA of which the threshold voltage |VTH| is compensated is written to the first node N1 in response to the data write gate signal GW. During a third duration DU3, the anode electrode of the organic light emitting diode OLED is initialized in response to the organic light emitting diode initialization gate signal GB. During a fourth duration DU4, the organic light emitting diode OLED emits light in response to the emission signal EM so that the pixel displays the image.

Although an off duration of the emission signal EM corresponds to the first to third durations DU1, DU2, and DU3 in the present example embodiment, the present disclosure is not limited thereto. For example, the off duration of the emission signal EM may include at least the data write duration DU2, and/or the off duration of the emission signal EM may be longer than the first to third durations DU1, DU2, and DU3.

During the first duration DU1, the data initialization gate signal GI may have an active level. For example, the active level of the data initialization gate signal GI may be a low level. When the data initialization gate signal GI has the active level, the (4-1)-th switching element T4-1 and the (4-2)-th switching element T4-2 are turned on so that the first initialization voltage VINT1 may be applied to the first node N1.

During the second duration DU2, the data write gate signal GW may have an active level. For example, the active level of the data write gate signal GW may be a low level. When the data write gate signal GW has the active level, a second switching element (e.g., a second transistor) T2, the (3-1)-th switching element T3-1, and the (3-2)-th switching element T3-2 are turned on. In addition, the first switching element T1 is turned on in response to the first initialization voltage VINT1.

A voltage corresponding to an absolute value |VTH| of the threshold voltage of the first switching element T1 subtracted from the data voltage VDATA (e.g., VDATA−|VTH|) may be charged at the first node N1 along a path generated by the first, second, (3-1)-th, and (3-2)-th switching elements T1, T2, T3-1, and T3-2.

During the third duration DU3, the organic light emitting diode initialization signal GB may have an active level. For example, the active level of the organic light emitting diode initialization signal GB may be a low level. When the organic light emitting diode initialization signal GB has the active level, the (7-1)-th switching element T7-1 and the (7-2)-th switching element T7-2 are turned on, so that the second initialization voltage VINT2 may be applied to the anode electrode of the organic light emitting diode OLED.

During the fourth duration DU4, the emission signal EM may have an active level. The active level of the emission signal EM may be a low level. When the emission signal EM has the active level, the fifth switching element T5 and the sixth switching element T6 are turned on. In addition, the first switching element T1 is turned on by the data voltage VDATA.

A driving current flows through the fifth switching element T5, the first switching element T1, and the sixth switching element T6 to drive the organic light emitting diode OLED. An intensity of the driving current may be determined by the level of the data voltage VDATA. A luminance of the organic light emitting diode OLED is determined by the intensity of the driving current.

The threshold voltage |VTH| is compensated during the second duration DU2, so that the driving current may be determined regardless of the threshold voltage |VTH| of the first switching element T1 when the organic light emitting diode OLED emits light during the fourth duration DU4.

Figure 4:
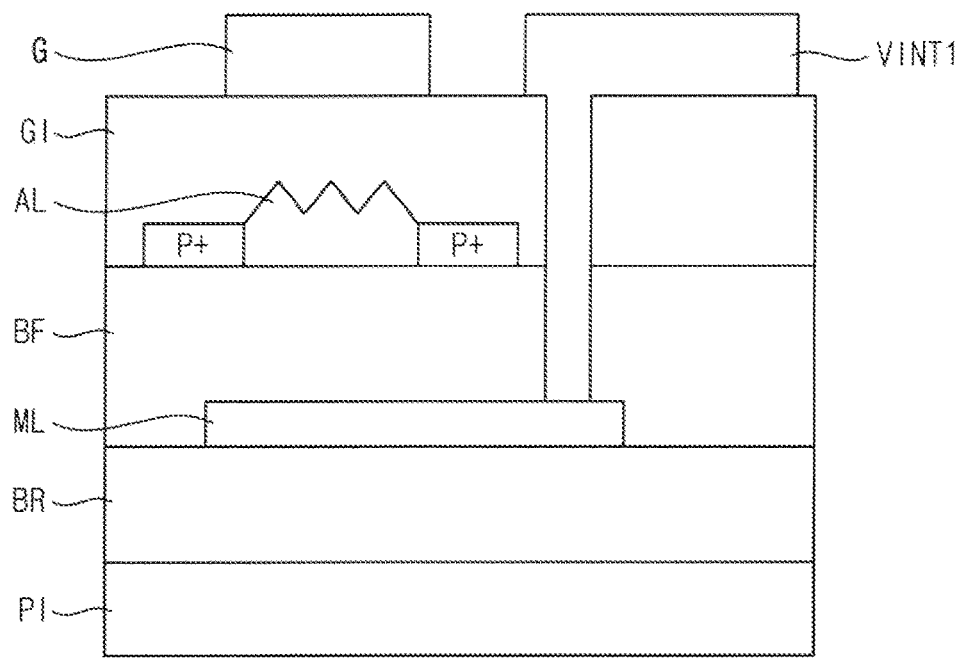
FIG. 4 is a cross-sectional view illustrating a portion of an organic light emitting element initialization switching element of FIG. 2.
Figure 5:
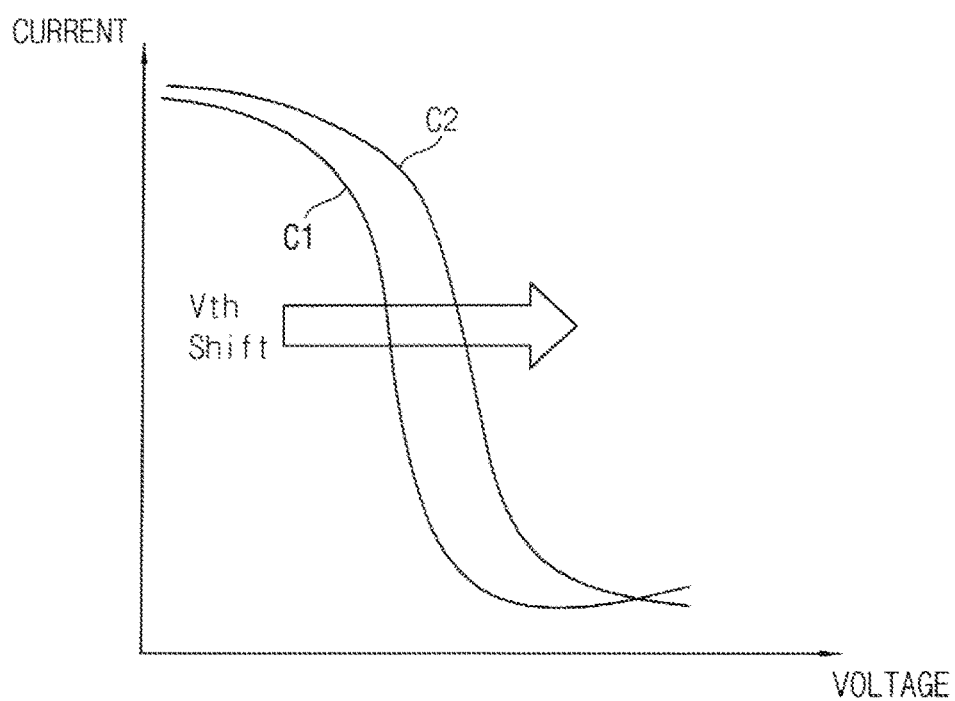
FIG. 5 is a graph illustrating a shift of a threshold voltage of the organic light emitting element initialization switching element of FIG. 2.

FIG. 4 is a cross-sectional view illustrating a portion of the organic light emitting element initialization switching element T7-1 and T7-2 of FIG. 2. FIG. 5 is a graph illustrating a shift of a threshold voltage of the organic light emitting element initialization switching element T7-1 and T7-2 of FIG. 2.

Referring to FIGS. 1 to 5, the (7-1)-th switching element T7-1 and the (7-2)-th switching element T7-2 may include a polyimide layer PI, a barrier layer BR disposed on the polyimide layer PI, a conductive layer ML disposed on the barrier layer BR, a buffer layer BF covering the conductive layer ML, a P+ layer disposed on the buffer layer BR, an active layer AL disposed on the buffer layer BF and the P+ layer, a gate insulation layer GI covering the P+ layer and the active layer AL, and a control electrode G disposed on the gate insulation layer GI.

In the present example embodiment, the first to (7-2)-th switching elements T1, T2, T3-1, T3-2, T4-1, T4-2, T5, T6, T7-1 and T7-2 may each include a control electrode G, an input electrode, an output electrode, and a conductive layer ML opposite to the control electrode G.

The same control signal may be applied to the control electrode G and the conductive layer ML of the first to sixth switching elements T1, T2, T3-1, T3-2, T4-1, T4-2, T5, and T6.

Unlike the first to sixth switching elements T1, T2, T3-1, T3-2, T4-1, T4-2, T5 and T6, different control signals may be applied to the control electrode G and the conductive layer ML of the (7-1)-th switching element T7-1 and the (7-2)-th switching element T7-2.

For example, the (7-1)-th switching element T7-1 and the (7-2)-th switching element T7-2 include a control electrode G for receiving the organic light emitting diode initialization signal GB, the input electrode for receiving the second initialization voltage VINT2, the output electrode connected to the anode electrode of the light organic light emitting element OLED, and the conductive layer ML opposite to the control electrode G and for receiving a compensation control signal that is different from the organic light emitting diode initialization signal GB.

In the present example embodiment, the compensation control signal may be the first initialization voltage VINT1. For example, the first initialization voltage VINT1 may be −3.5V, and the second initialization voltage VINT2 may be −14.1V. For example, each of the first initialization voltage VINT1 and the second initialization voltage VINT2 may be less than 0, and an absolute value of the first initialization voltage VINT1 may be less than that of the second initialization voltage VINT2.

Thus, the compensation control signal VINT1 is applied to the conductive layers ML of the (7-1)-th switching element T7-1 and the (7-2)-th switching element T7-2, so that threshold voltages Vth of the (7-1)-th switching element T7-1 and the (7-2)-th switching element T7-2 may be shifted in a positive direction.

In FIG. 5, the curve C1 represents a current voltage curve of the (7-1)-th switching element T7-1 and the (7-2)-th switching element T7-2 when the organic light emitting diode initialization signal GB is applied to the conductive layers ML of the (7-1)-th switching element T7-1 and the (7-2)-th switching element T7-2. The curve C2 represents a current voltage curve of the (7-1)-th switching element T7-1 and the (7-2)-th switching element T7-2 when the compensation control signal VINT1 is applied to the conductive layers ML of the (7-1)-th switching element T7-1 and the (7-2)-th switching element T7-2.

The threshold voltage Vth of the (7-1)-th switching element T7-1 and the (7-2)-th switching element T7-2 is shifted in the positive direction so that the driving voltage (e.g., the absolute value of the low level VGL of the gate signal) of the display apparatus may be reduced. Accordingly, the power consumption of the display apparatus may be reduced. In addition, the driving voltage (e.g., the absolute value of the low level VGL of the gate signal) of the display apparatus is reduced, so that a reliability of the gate driver 300 may be enhanced.

Figure 6A:
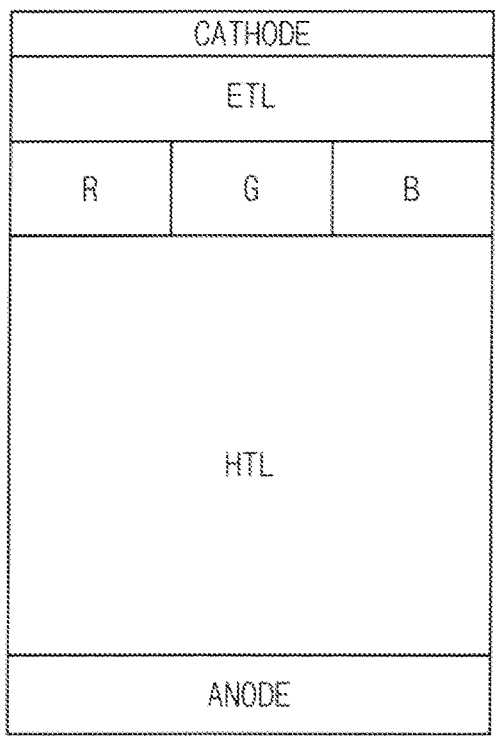
FIG. 6A is a cross-sectional view illustrating an example of an organic light emitting element of FIG. 2.
Figure 6B:
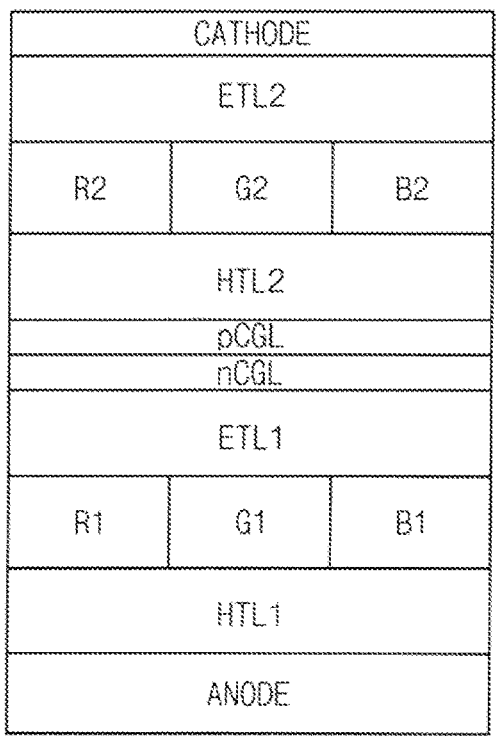
FIG. 6B is a cross-sectional view illustrating an example of an organic light emitting element of FIG. 2.

FIG. 6A is a cross-sectional view illustrating an example of an organic light emitting element of FIG. 2. FIG. 6B is a cross-sectional view illustrating an example of an organic light emitting element of FIG. 2.

In FIG. 6A, for example, the organic light emitting element OLED may include a single light emitting layer R, G, and B. In FIG. 6B, for example, the organic light emitting element OLED may include two light emitting layers R1, G1, B1, R2, G2, and B2 to enhance reliability and a lifetime thereof.

Referring to FIG. 6A, the organic light emitting element OLED may include the anode electrode ANODE, a hole transport layer HTL disposed on the anode electrode ANODE, the light emitting layer R, G, and B disposed on the hole transport layer HTL, an electron transport layer ETL disposed on the light emitting layer R, G, and B, and the cathode electrode CATHODE disposed on the electron transport layer ETL.

Referring to FIG. 6B, the organic light emitting element OLED may include the anode electrode ANODE, a first light emitting layer R1, G1, and B1 disposed on the anode electrode ANODE, a second light emitting layer R2, G2, and B2 disposed on the first light emitting layer R1, G1, and B1, and the cathode electrode CATHODE disposed on the second light emitting layer R2, G2, and B2.

For example, the organic light emitting element OLED may further include a first hole transport layer HTL1 disposed between the anode electrode ANODE and the first light emitting layer R1, G1, and B1, a first electron transport layer ETL1 disposed on the first light emitting layer R1, G1, and B1, an n-type charge generation layer nCGL disposed on the first electron transport layer ETL1, a p-type charge generation layer pCGL disposed on the n-type charge generation layer nCGL, a second hole transport layer HTL2 disposed between the p-type charge generation layer pCGL and the second light emitting layer R2, G2, and B2, and a second electron transport layer ETL2 disposed between the second light emitting layer R2, G2, and B2 and the cathode electrode CATHODE.

When the display apparatus includes the organic light emitting element OLED including the first and second light emitting layers R1, G1, B1, R2, G2, and B2, the driving voltage of the display apparatus may be further increased.

FIG. 7 is a table illustrating voltages at nodes of an organic light emitting element and an organic light emitting element initialization switching element according to a comparative example. FIG. 8 is a table illustrating voltages at nodes of the organic light emitting element and the organic light emitting element initialization switching element of FIG. 2.

In FIG. 7, for example, the organic light emitting diode initialization signal GB is applied to the control electrodes G and the conductive layers ML of the (7-1)-th switching element T7-1 and the (7-2)-th switching element T7-2. In FIG. 8, for example, the organic light emitting diode initialization signal GB is applied to the control electrodes G of the (7-1)-th switching element T7-1 and the (7-2)-th switching element T7-2, and the compensation control signal VINT1 is applied to the conductive layers ML of the (7-1)-th switching element T7-1 and the (7-2)-th switching element T7-2. In FIGS. 7 and 8, for example, the second initialization voltage VINT2 and the second power voltage ELVSS may be −14.1V. In FIGS. 7 and 8, a single switching element (e.g., a single seventh transistor) T7 is illustrated instead of the (7-1)-th switching element T7-1 and the (7-2)-th switching element T7-2 for convenience of illustration and explanation.

In FIG. 7, when the low level VGL of the gate signal (e.g., GI, GB, and GW) is −13.6V, the anode voltage is −11.7V. In this case, the gate source voltage VGS of the seventh switching element T7 is less than a threshold voltage of the seventh switching element T7, so that the seventh switching element T7 does not operate normally. When the low level VGL of the gate signal (e.g., GI, GB, and GW) is −14.6V, the anode voltage is −12.3V. In this case, the gate source voltage VGS of the seventh switching element T7 is less than the threshold voltage of the seventh switching element T7, so that the seventh switching element T7 does not operate normally.

When the low level VGL of the gate signal (e.g., GI, GB, and GW) is −17.6V, the anode voltage is −14.1V. In this case, the gate source voltage VGS of the seventh switching element T7 reaches the threshold voltage of the seventh switching element T7, so that the seventh switching element T7 may operate normally.

In the comparative example of FIG. 7, the pixel operates normally when the low level VGL of the gate signal (e.g., GI, GB, and GW) is equal to or less than −17.6V.

In FIG. 8, for example, the compensation control signal VINT1 is applied to the conductive layer ML, so that the threshold voltage of the seventh switching element T7 may be shifted in the positive direction by 1.5V to 2V as shown in FIG. 5.

In FIG. 8, when the low level VGL of the gate signal (e.g., GI, GB, and GW) is −13.6V, the anode voltage is −12.7V. In this case, the gate source voltage VGS of the seventh switching element T7 is less than a threshold voltage of the seventh switching element T7, so that the seventh switching element T7 does not operate normally. When the low level VGL of the gate signal (e.g., GI, GB, and GW) is −14.6V, the anode voltage is −13.6V. In this case, the gate source voltage VGS of the seventh switching element T7 is less than the threshold voltage of the seventh switching element T7, so that the seventh switching element T7 does not operate normally.

When the low level VGL of the gate signal (e.g., GI, GB, and GW) is −15.6V, the anode voltage is −14.1V. In this case, the gate source voltage VGS of the seventh switching element T7 reaches the threshold voltage of the seventh switching element T7, so that the seventh switching element T7 may operate normally.

In the case of FIG. 8, the pixel operates normally when the low level VGL of the gate signal (e.g., GI, GB, and GW) is equal to or less than −15.6V, so that the absolute value of the driving voltage VGL may decrease by 2V when compared to the comparative example of FIG. 7. When the driving voltage VGL is decreased, the power consumption of the display apparatus may be reduced. In addition, when the driving voltage VGL is decreased, the reliability of the gate driver 300 may be enhanced.

According to the present example embodiment, the signal VINT1 that is different from the signal GB applied to the control electrodes G of the organic light emitting element initialization switching elements T7-1 and T7-2 is applied to the conductive layers ML opposite to the control electrodes G of the organic light emitting element initialization switching elements T7-1 and T7-2, so that the threshold voltage of the organic light emitting element initialization switching elements T7-1 and T7-2 may be decreased.

Thus, the power consumption of the display apparatus may be reduced, and the reliability of the gate driver 300 may be enhanced.

Figure 9:
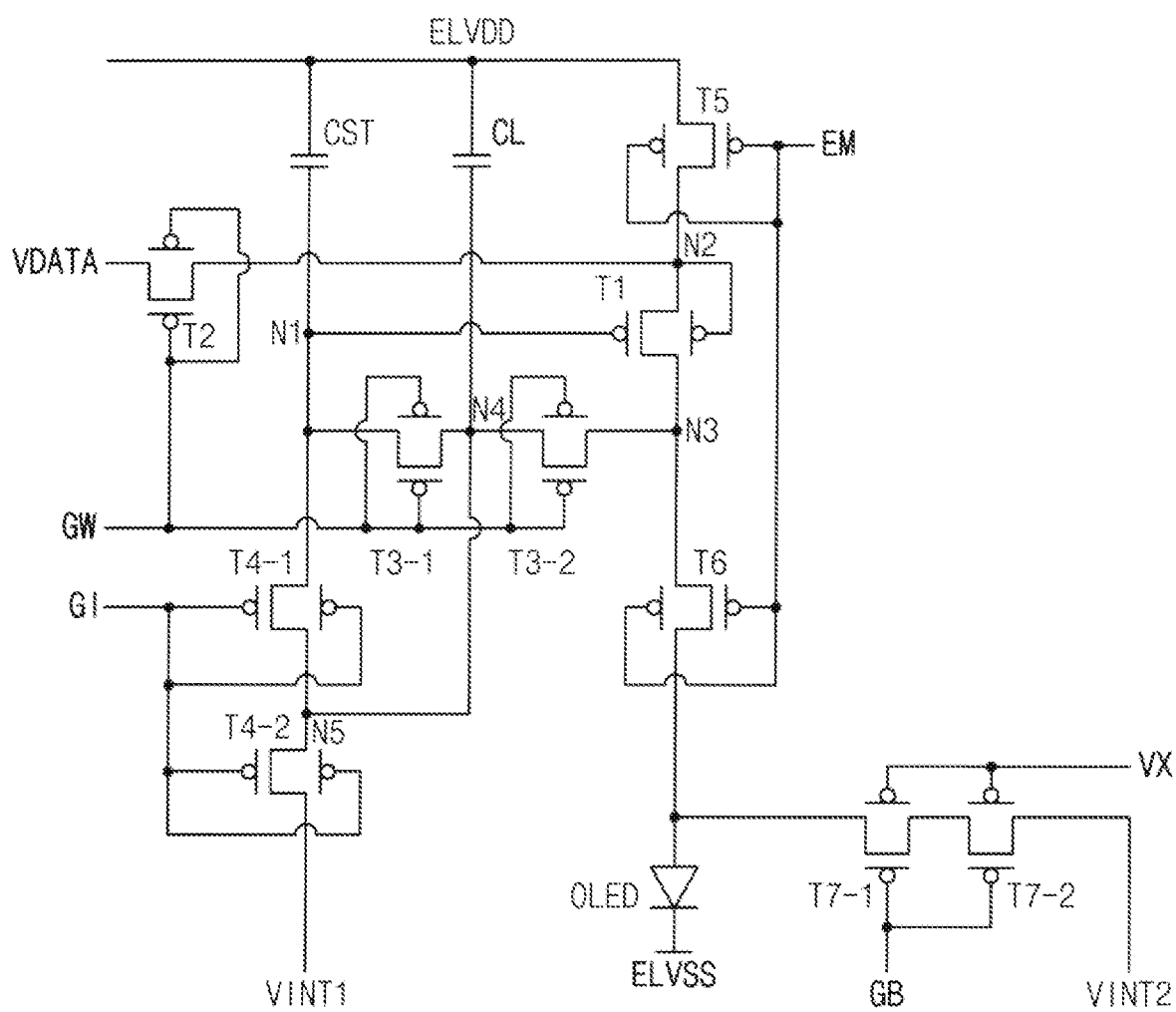
FIG. 9 is a circuit diagram illustrating a pixel of a display panel according to an example embodiment of the present disclosure.

FIG. 9 is a circuit diagram illustrating a pixel of a display panel according to an example embodiment of the present disclosure.

The display apparatus according to the present example embodiment is the same or substantially the same as (or similar to) the display apparatus of the example embodiments described with reference to FIGS. 1 to 8, except for the signal applied to the conductive layers of the (7-1)-th switching element and the (7-2)-th switching element may be different. Thus, the same reference numerals are used to refer to the same or substantially the same (or similar) components, elements, and parts as those described with reference to the example embodiments of FIGS. 1 to 8, and thus, redundant description thereof may not be repeated.

Referring to FIGS. 1 and 3 to 9, the display apparatus includes a display panel 100 and a display panel driver. The display panel driver includes a driving controller 200, a gate driver 300, a gamma reference voltage generator 400, a data driver 500, and an emission driver 600.

At least one of the pixels may include a driving switching element (e.g., a driving switching transistor) T1, a data initializer T4-1 and T4-2, a data writer T2, T3-1 and T3-2, an organic light emitting element OLED, an organic light emitting element initializer T7-1 and T7-2, and a light emitting controller T5 and T6. The pixel may further include a storage capacitor CST and a stabilization capacitor CL.

The organic light emitting element initializer T7-1 and T7-2 initializes an anode electrode of the organic light emitting element to a second initialization voltage VINT2 based on the organic light emitting diode initialization signal GB.

In the present example embodiment, each of the first to (7-2)-th switching elements T1, T2, T3-1, T3-2, T4-1, T4-2, T5, T6, T7-1, and T7-2 may include a control electrode G, an input electrode, an output electrode, and a conductive layer ML opposite to the control electrode G.

The same control signal may be applied to the control electrode G and the conductive layer ML of the first to sixth switching elements T1, T2, T3-1, T3-2, T4-1, T4-2, T5, and T6.

Unlike the first to sixth switching elements T1, T2, T3-1, T3-2, T4-1, T4-2, T5, and T6, different control signals may be applied to the control electrodes G and the conductive layers ML of the (7-1)-th switching element T7-1 and the (7-2)-th switching element T7-2.

In the present example embodiment, a compensation control signal VX may be independently formed from the other driving signals. The (7-1)-th switching element T7-1 and the (7-2)-th switching element T7-2 may each be a p-type switching element, so that the compensation control signal VX may be applied in a positive direction. As another example, the (7-1)-th switching element T7-1 and the (7-2)-th switching element T7-2 may each be an n-type switching element, so that the compensation control signal VX may be applied in a negative direction.

For example, a shift range of the threshold voltage Vth of the (7-1)-th switching element T7-1 and the (7-2)-th switching element T7-2 may be greater than 0V and less than 10V.

According to the present example embodiment, the signal VX that is different from the signal GB applied to the control electrode G of the organic light emitting element initialization switching element T7-1 and T7-2 is applied to the conductive layer ML opposite to the control electrode G of the organic light emitting element initialization switching element T7-1 and T7-2, so that the threshold voltage of the organic light emitting element initialization switching element T7-1 and T7-2 may be decreased.

Thus, the power consumption of the display apparatus may be reduced, and the reliability of the gate driver 300 may be enhanced.

Figure 10:
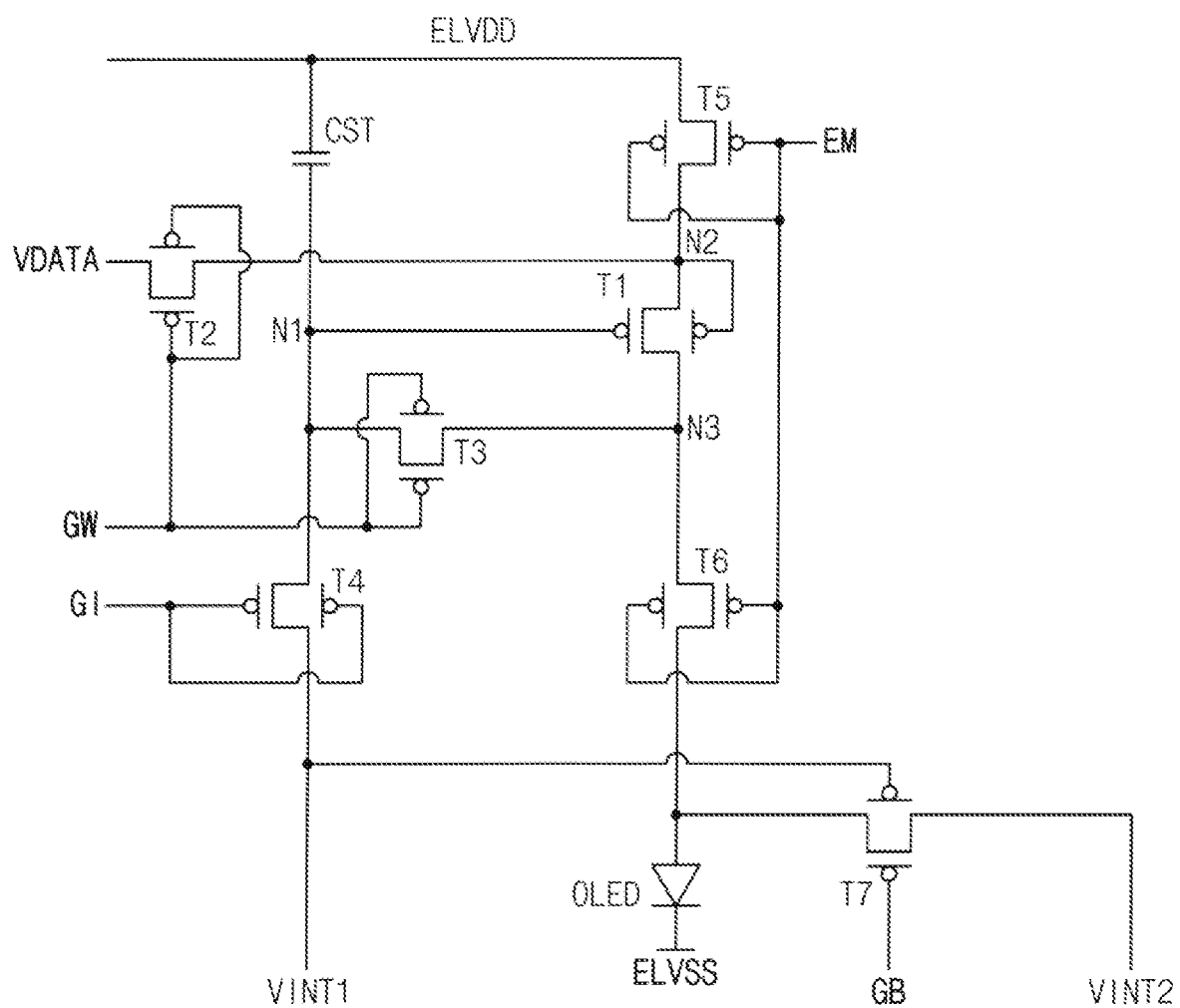
FIG. 10 is a circuit diagram illustrating a pixel of a display panel according to an example embodiment of the present disclosure.

FIG. 10 is a circuit diagram illustrating a pixel of a display panel according to an example embodiment of the present disclosure.

The display apparatus according to the present example embodiment is the same or substantially the same as (or similar to) the display apparatus of the example embodiments described with reference to FIGS. 1 to 8, except for the pixel circuit may be different. Thus, the same reference numerals are used to refer to the same or substantially the same (or similar) components, elements, and parts as those described with reference to the example embodiments of FIGS. 1 to 8, and thus, redundant description thereof may not be repeated.

Referring to FIGS. 1, 3 to 8, and 10, the display apparatus includes a display panel 100 and a display panel driver. The display panel driver includes a driving controller 200, a gate driver 300, a gamma reference voltage generator 400, a data driver 500, and an emission driver 600.

At least one of the pixels may include a driving switching element T1, a data initializer T4, a data writer T2 and T3, an organic light emitting element OLED, an organic light emitting element initializer T7, and a light emitting controller T5 and T6. The pixel may further include a storage capacitor CST and a stabilization capacitor CL.

In the present example embodiment, the second data writer T3 may include a single switching element (e.g., a single third transistor) T3 unlike that in the embodiment of FIG. 2.

In the present example embodiment, the data initializer T4 may include a single switching element (e.g., a single fourth transistor) T4 unlike that in the embodiment of FIG. 2.

In the present example embodiment, the organic light emitting element initializer T7 may include a single switching element (e.g., a single seventh transistor) T7 unlike that in the embodiment of FIG. 2.

The organic light emitting element initializer T7 initializes an anode electrode of the organic light emitting element to a second initialization voltage VINT2 based on the organic light emitting diode initialization signal GB.

In the present example embodiment, each of the first to seventh switching elements T1 to T7 may include a control electrode G, an input electrode, an output electrode, and a conductive layer ML opposite to the control electrode G.

The same control signal may be applied to the control electrode G and the conductive layer ML of the first to sixth switching elements T1 to T6.

Unlike the first to sixth switching elements T1 to T6, different control signals may be applied to the control electrode G and the conductive layer ML of the seventh switching element T7.

In the present example embodiment, the compensation control signal may be the first initialization voltage VINT1. As another example, the compensation control signal may be independently generated from the other driving signals as described with reference to FIG. 9.

According to the present example embodiment, the signal VINT1 that is different from the signal GB applied to the control electrode G of the organic light emitting element initialization switching element T7 is applied to the conductive layer ML opposite to the control electrode G of the organic light emitting element initialization switching element T7, so that the threshold voltage of the organic light emitting element initialization switching element T7 may be decreased.

Thus, the power consumption of the display apparatus may be reduced, and the reliability of the gate driver 300 may be enhanced.

Figure 11:
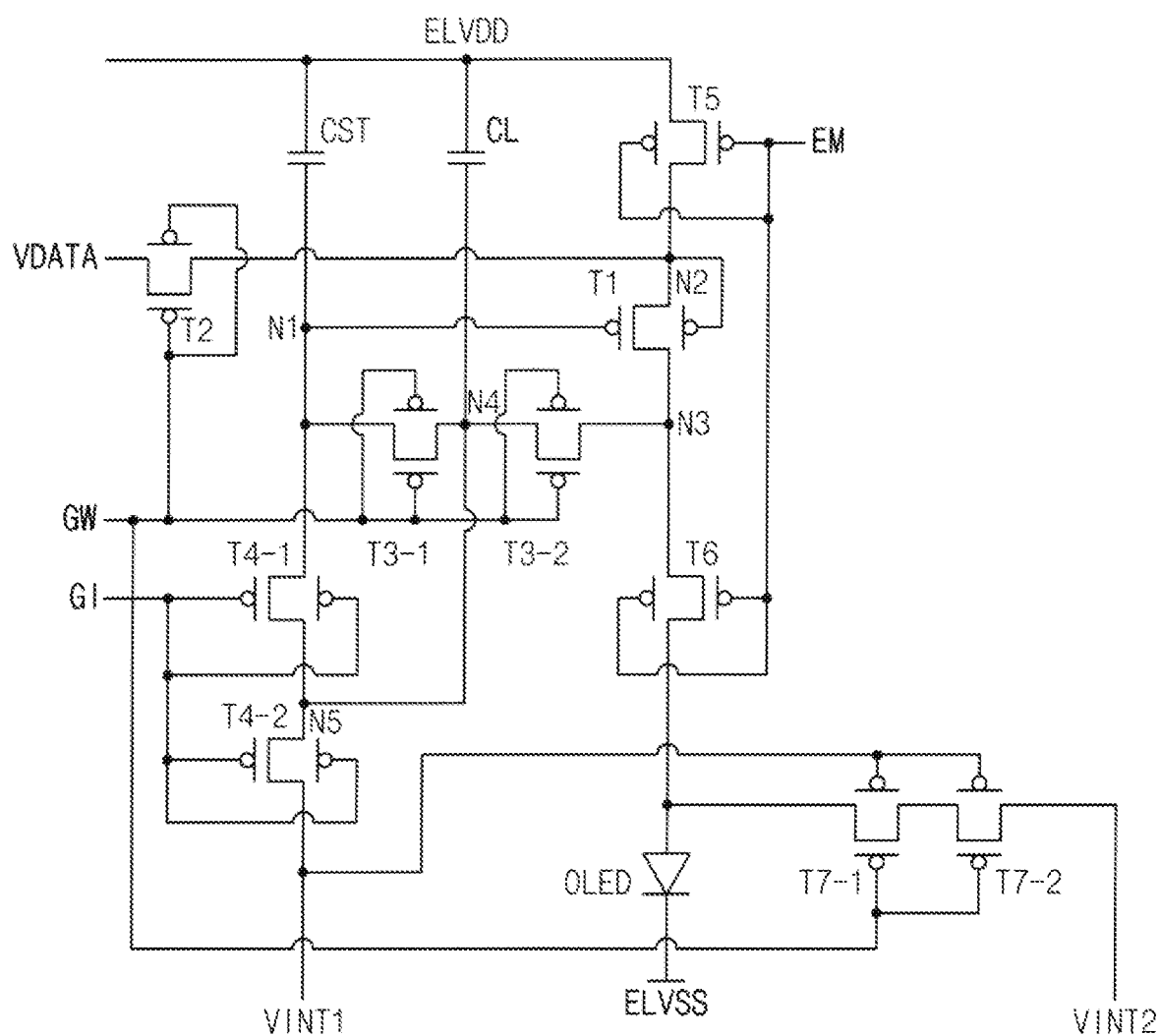
FIG. 11 is a circuit diagram illustrating a pixel of a display panel according to an example embodiment of the present disclosure.

FIG. 11 is a circuit diagram illustrating a pixel of a display panel according to an example embodiment of the present disclosure.

The display apparatus according to the present example embodiment is the same or substantially the same as (or similar to) the display apparatus of the example embodiments described with reference to FIGS. 1 to 8, except for the signal applied to the control electrodes of the (7-1)-th switching element and the (7-2)-th switching element may be different. Thus, the same reference numerals are used to refer to the same or substantially the same (or similar) components, elements, and parts as those described with reference to the example embodiments of FIGS. 1 to 8, and thus, redundant description thereof may not be repeated.

Referring to FIGS. 1, 3 to 8, and 11, the display apparatus includes a display panel 100 and a display panel driver. The display panel driver includes a driving controller 200, a gate driver 300, a gamma reference voltage generator 400, a data driver 500, and an emission driver 600.

At least one of the pixels may include a driving switching element T1, a data initializer T4-1 and T4-2, a data writer T2, T3-1 and T3-2, an organic light emitting element OLED, an organic light emitting element initializer T7-1 and T7-2, and a light emitting controller T5 and T6. The pixel may further include a storage capacitor CST and a stabilization capacitor CL.

The organic light emitting element initializer T7-1 and T7-2 initializes an anode electrode of the organic light emitting element to a second initialization voltage VINT2 based on the organic light emitting diode initialization signal GB.

In the present example embodiment, the organic light emitting diode initialization signal GB may have a phase that is the same as a phase of the data write gate signal GW. For example, as shown in FIG. 11, the data write gate signal GW may be directly applied to the control electrode G of the organic light emitting element initializer T7-1 and T7-2, rather than the organic light emitting diode initialization signal GB.

In the present example embodiment, each of the first to (7-2)-th switching elements T1, T2, T3-1, T3-2, T4-1, T4-2, T5, T6, T7-1, and T7-2 may include a control electrode G, an input electrode, an output electrode, and a conductive layer ML opposite to the control electrode G.

The same control signal may be applied to the control electrode G and the conductive layer ML of the first to sixth switching elements T1, T2, T3-1, T3-2, T4-1, T4-2, T5, and T6.

Unlike the first to sixth switching elements T1, T2, T3-1, T3-2, T4-1, T4-2, T5, and T6, different control signals may be applied to the control electrodes G and the conductive layers ML of the (7-1)-th switching element T7-1 and the (7-2)-th switching element T7-2.

In the present example embodiment, the compensation control signal may be the first initialization voltage VINT1. In another example, the compensation control signal may be independently generated from the other driving signals as described with reference to FIG. 9.

According to the present example embodiment, the signal VINT1 that is different from the signal GW applied to the control electrodes G of the organic light emitting element initialization switching elements T7-1 and T7-2 is applied to the conductive layers ML opposite to the control electrodes G of the organic light emitting element initialization switching elements T7-1 and T7-2, so that the threshold voltage of the organic light emitting element initialization switching elements T7-1 and T7-2 may be decreased.

Thus, the power consumption of the display apparatus may be reduced, and the reliability of the gate driver 300 may be enhanced.

Figure 12:
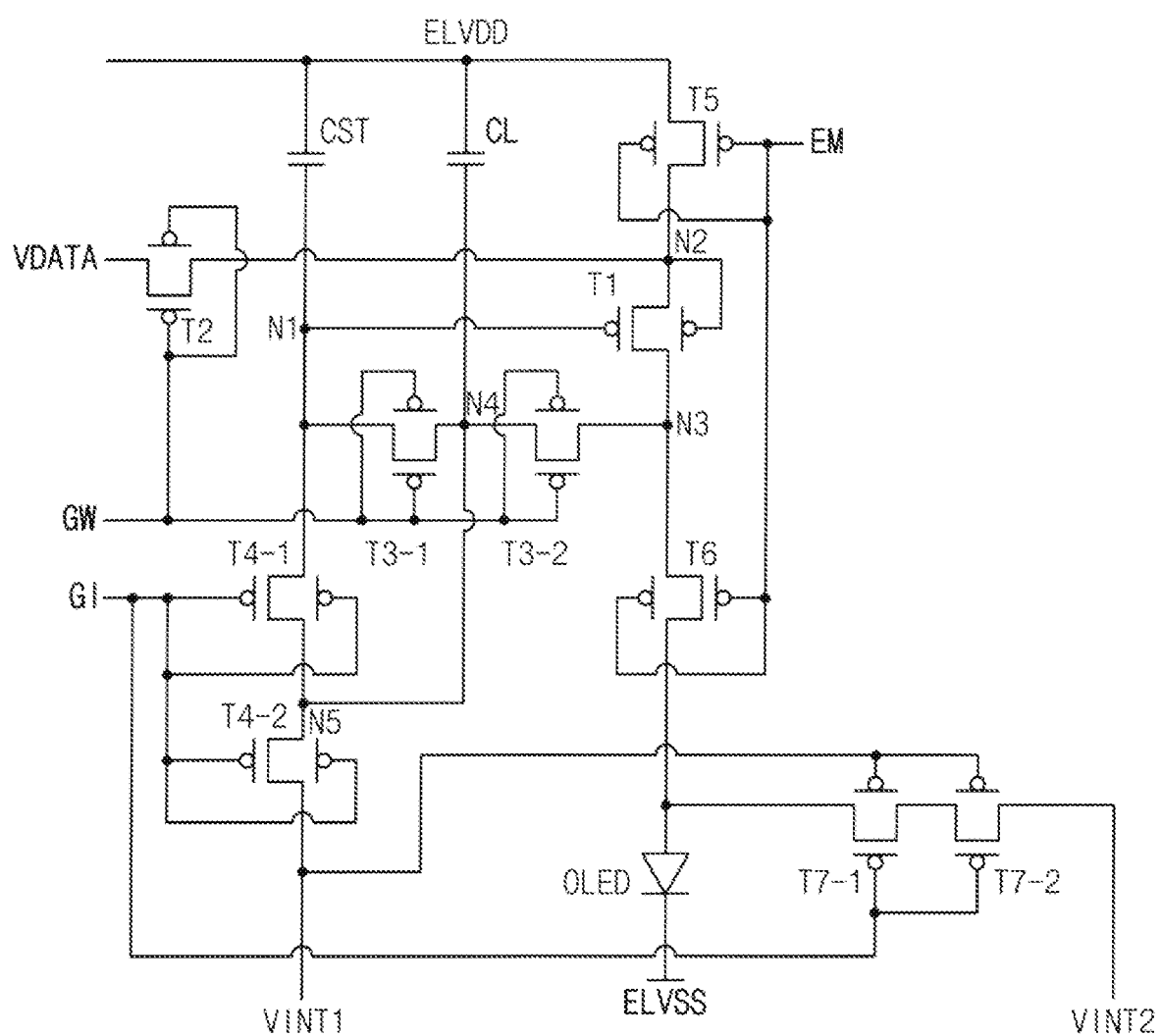
FIG. 12 is a circuit diagram illustrating a pixel of a display panel according to an example embodiment of the present disclosure.

FIG. 12 is a circuit diagram illustrating a pixel of a display panel according to an example embodiment of the present disclosure.

The display apparatus according to the present example embodiment is the same or substantially the same as (or similar to) the display apparatus of the example embodiments described with reference to FIGS. 1 to 8, except for the signal applied to the control electrodes of the (7-1)-th switching element and the (7-2)-th switching element may be different. Thus, the same reference numerals are used to refer to the same or substantially the same (or similar) components, elements, and parts as those described with reference to the example embodiments of FIGS. 1 to 8, and thus, redundant description thereof may not be repeated.

Referring to FIGS. 1, 3 to 8, and 12, the display apparatus includes a display panel 100 and a display panel driver. The display panel driver includes a driving controller 200, a gate driver 300, a gamma reference voltage generator 400, a data driver 500, and an emission driver 600.

At least one of the pixels may include a driving switching element T1, a data initializer T4-1 and T4-2, a data writer T2, T3-1 and T3-2, an organic light emitting element OLED, an organic light emitting element initializer T7-1 and T7-2, and a light emitting controller T5 and T6. The pixel may further include a storage capacitor CST and a stabilization capacitor CL.

The organic light emitting element initializer T7-1 and T7-2 initializes an anode electrode of the organic light emitting element to a second initialization voltage VINT2 based on the organic light emitting diode initialization signal GB.

In the present example embodiment, the organic light emitting diode initialization signal GB may have a phase that is the same as a phase of the data initialization gate signal GI. For example, as shown in FIG. 12, the data initialization gate signal GI may be directly applied to the control electrode G of the organic light emitting element initializer T7-1 and T7-2, rather than the organic light emitting diode initialization signal GB.

In the present example embodiment, each of the first to (7-2)-th switching elements T1, T2, T3-1, T3-2, T4-1, T4-2, T5, T6, T7-1, and T7-2 may include a control electrode G, an input electrode, an output electrode, and a conductive layer ML opposite to the control electrode G.

The same control signal may be applied to the control electrode G and the conductive layer ML of the first to sixth switching elements T1, T2, T3-1, T3-2, T4-1, T4-2, T5, and T6.

Unlike the first to sixth switching elements T1, T2, T3-1, T3-2, T4-1, T4-2, T5, and T6, different control signals may be applied to the control electrodes G and the conductive layers ML of the (7-1)-th switching element T7-1 and the (7-2)-th switching element T7-2.

In the present example embodiment, the compensation control signal may be the first initialization voltage VINT1. As another example, the compensation control signal may be independently generated from other driving signals as described with reference to FIG. 9.

According to the present example embodiment, the signal VINT1 that is different from the signal GI applied to the control electrodes G of the organic light emitting element initialization switching elements T7-1 and T7-2 is applied to the conductive layers ML opposite to the control electrodes G of the organic light emitting element initialization switching elements T7-1 and T7-2, so that the threshold voltage of the organic light emitting element initialization switching elements T7-1 and T7-2 may be decreased.

Thus, the power consumption of the display apparatus may be reduced, and the reliability of the gate driver 300 may be enhanced.

INDUSTRIAL AVAILABILITY

According to the pixel circuit and the display apparatus of example embodiments of the present disclosure as described above, the reliability thereof may be enhanced, and the power consumption may be reduced due to the decrease of the driving voltage.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

EXPLANATION OF REFERENCE NUMERALS

| 100: | display panel | 200: | driving controller |
|---|---|---|---|
| 300: | gate driver | 400: | gamma reference voltage generator |
| 500: | data driver | 600: | emission driver |

The invention claimed is:

1. A pixel circuit comprising:
a driving switching element;
a data initializer configured to initialize a voltage of a control electrode of the driving switching element to a first initialization voltage based on a data initialization gate signal;
a data writer configured to write a data voltage to the control electrode of the driving switching element based on a data write gate signal;
an organic light emitting element;
an organic light emitting element initializer configured to initialize an anode electrode of the organic light emitting element to a second initialization voltage based on an organic light emitting element initialization gate signal; and
a light emitting controller configured to control an emission of the organic light emitting element based on an emission signal,
wherein the organic light emitting element initializer comprises:
a control electrode configured to receive the organic light emitting element initialization gate signal;
an input electrode configured to receive the second initialization voltage;
an output electrode connected to the anode electrode; and
a conductive layer opposite to the control electrode of the organic light emitting element initializer, and configured to receive a compensation control signal that is different from the organic light emitting element initialization gate signal to shift a threshold voltage of the organic light emitting element initializer.

2. The pixel circuit of claim 1, wherein the compensation control signal is the first initialization voltage.

3. The pixel circuit of claim 1, wherein the data initializer comprises a control electrode configured to receive the data initialization gate signal, an input electrode configured to receive the first initialization voltage, and an output electrode connected to the control electrode of the driving switching element.

4. The pixel circuit of claim 1, wherein the data writer comprises a first data writer comprising a control electrode configured to receive the data write gate signal, an input electrode configured to receive the data voltage, and an output electrode connected to an input electrode of the driving switching element.

5. The pixel circuit of claim 4, wherein the data writer further comprises a second data writer comprising a control electrode configured to receive the data write gate signal, an input electrode connected to an output electrode of the driving switching element, and an output electrode connected to the control electrode of the driving switching element.

6. The pixel circuit of claim 1, further comprising a storage capacitor comprising a first electrode configured to receive a first power voltage, and a second electrode connected to the control electrode of the driving switching element.

7. The pixel circuit of claim 1, wherein the organic light emitting element initializer comprises a (7-1)-th switching element and a (7-2)-th switching element that are connected in series,
   wherein the (7-1)-th switching element comprises a control electrode configured to receive the organic light emitting element initialization gate signal, an input electrode connected to an output electrode of the (7-2)-th switching element, and an output electrode connected to the anode electrode of the organic light emitting element, and
   wherein the (7-2)-th switching element comprises a control electrode configured to receive the organic light emitting element initialization gate signal, an input electrode configured to receive the second initialization voltage, and the output electrode connected to the input electrode of the (7-1)-th switching element.

8. The pixel circuit of claim 1, wherein the light emitting controller comprises a first light emitting controller comprising a control electrode configured to receive the emission signal, an input electrode configured to receive a first power voltage, and an output electrode connected to an input electrode of the driving switching element.

9. The pixel circuit of claim 8, wherein the light emitting controller further comprises a second light emitting controller comprising a control electrode configured to receive the emission signal, an input electrode connected to an output electrode of the driving switching element, and an output electrode connected to the anode electrode of the organic light emitting element.

10. The pixel circuit of claim 1, wherein the organic light emitting element comprises:
    the anode electrode;
    a first light emitting layer on the anode electrode;
    a second light emitting layer on the first light emitting layer; and
    a cathode electrode on the second light emitting layer.

11. The pixel circuit of claim 10, wherein the organic light emitting element further comprises:
    a first hole transport layer between the anode electrode and the first light emitting layer;
    a first electron transport layer on the first light emitting layer;
    an n-type charge generation layer on the first electron transport layer;
    a p-type charge generation layer on the n-type charge generation layer;
    a second hole transport layer between the p-type charge generation layer and the second light emitting layer; and
    a second electron transport layer between the second light emitting layer and the cathode electrode.

12. The pixel circuit of claim 1, wherein the organic light emitting element initialization gate signal has a phase that is the same as a phase of the data write gate signal.

13. The pixel circuit of claim 1, wherein the organic light emitting element initialization gate signal has a phase that is the same as a phase of the data initialization gate signal.

14. A pixel circuit comprising:
    a driving switching element;
    a data initializer configured to initialize a voltage of a control electrode of the driving switching element to a first initialization voltage based on a data initialization gate signal;
    a data writer configured to write a data voltage to the control electrode of the driving switching element based on a data write gate signal;
    an organic light emitting element;
    an organic light emitting element initializer configured to initialize an anode electrode of the organic light emitting element to a second initialization voltage based on an organic light emitting element initialization gate signal; and
    a light emitting controller configured to control an emission of the organic light emitting element based on an emission signal,
    wherein the organic light emitting element initializer comprises:
       a control electrode configured to receive the organic light emitting element initialization gate signal;
       an input electrode configured to receive the second initialization voltage;
       an output electrode connected to the anode electrode; and
       a conductive layer opposite to the control electrode of the organic light emitting element initializer, and configured to receive a compensation control signal that is different from the organic light emitting element initialization gate signal,
    wherein the data writer comprises a first data writer comprising a control electrode configured to receive the data write gate signal, an input electrode configured to receive the data voltage, and an output electrode connected to an input electrode of the driving switching element,
    wherein the data writer further comprises a second data writer comprising a control electrode configured to receive the data write gate signal, an input electrode connected to an output electrode of the driving switching element, and an output electrode connected to the control electrode of the driving switching element,
    wherein the second data writer comprises a (3-1)-th switching element and a (3-2)-th switching element that are connected in series,
    wherein the (3-1)-th switching element comprises a control electrode configured to receive the data write gate signal, an input electrode connected to an output electrode of the (3-2)-th switching element, and an output electrode connected to the control electrode of the driving switching element, and
    wherein the (3-2)-th switching element comprises a control electrode configured to receive the data write gate signal, an input electrode connected to the output electrode of the driving switching element, and the output electrode connected to the input electrode of the (3-1)-th switching element.

15. The pixel circuit of claim 14, further comprising a stabilization capacitor comprising a first electrode configured to receive a first power voltage, and a second electrode connected to the input electrode of the (3-1)-th switching element.

16. The pixel circuit of claim 14, wherein the data initializer comprises a (4-1)-th switching element and a (4-2)-th switching element that are connected in series,
wherein the (4-1)-th switching element comprises a control electrode configured to receive the data initialization gate signal, an input electrode connected to an output electrode of the (4-2)-th switching element, and an output electrode connected to the control electrode of the driving switching element, and
wherein the (4-2)-th switching element comprises a control electrode configured to receive the data initialization gate signal, an input electrode configured to receive the first initialization voltage, and the output electrode connected to the input electrode of the (4-1)-th switching element.

17. The pixel circuit of claim 16, wherein the input electrode of the (4-1)-th switching element is connected to the input electrode of the (3-1)-th switching element.

18. A display apparatus comprising:
a display panel comprising a plurality of pixels;
a gate driver configured to output a gate signal to the display panel;
a data driver configured to output a data voltage to the display panel; and
an emission driver configured to output an emission signal to the display panel,
wherein at least one of the pixels comprises:
a driving switching element;
a data initializer configured to initialize a voltage of a control electrode of the driving switching element to a first initialization voltage based on a data initialization gate signal;
a data writer configured to write the data voltage to the control electrode of the driving switching element based on a data write gate signal;
an organic light emitting element;
an organic light emitting element initializer configured to initialize an anode electrode of the organic light emitting element to a second initialization voltage based on an organic light emitting element initialization gate signal; and
a light emitting controller configured to control an emission of the organic light emitting element based on the emission signal,
wherein the organic light emitting element initializer comprises:
a control electrode configured to receive the organic light emitting element initialization gate signal;
an input electrode configured to receive the second initialization voltage;
an output electrode connected to the anode electrode; and
a conductive layer opposite to the control electrode of the organic light emitting element initializer, and configured to receive a compensation control signal that is different from the organic light emitting element initialization gate signal to shift a threshold voltage of the organic light emitting element initializer.

19. The display apparatus of claim 18, wherein the compensation control signal is the first initialization voltage.

* * * * *